United States Patent

Yamada et al.

[11] Patent Number: 4,746,373
[45] Date of Patent: May 24, 1988

[54] METHOD OF MANUFACTURING COMPOUND SUPERCONDUCTORS

[75] Inventors: Yutaka Yamada, Kawasaki; Satoru Murase; Mitsuo Sasaki, both of Yokohama; Ei Nakamura, Yokosuka; Hiroaki Kumakura; Kazumasa Togano, both of Ibaraki; Kyoji Tachikawa, Tokyo, all of Japan

[73] Assignees: Kabushiki Kaisha Toshiba, Kawasaki; National Research Institute for Metals, Tokyo, both of Japan

[21] Appl. No.: 863,189

[22] Filed: May 14, 1986

[30] Foreign Application Priority Data

May 16, 1985 [JP] Japan .................................. 60-102762
Oct. 29, 1985 [JP] Japan .................................. 60-240542

[51] Int. Cl.⁴ ............................................ H01L 39/24
[52] U.S. Cl. ................................ 148/11.5 P; 148/133; 148/903; 29/599
[58] Field of Search ............... 148/11.5 P, 11.5 Q, 148/11.5 F, 133, 4, 900, 903; 29/599

[56] References Cited

U.S. PATENT DOCUMENTS 4,363,675 12/1982 Yoshizaki ............... 148/11.5 P
4,411,712 10/1983 Marancik ................. 148/11.5 P
4,505,762 3/1985 Fukutsuka et al. ............ 148/133
4,591,482 5/1986 Nyce ............................ 148/133
4,664,933 5/1987 Tachikawa et al. ............. 427/12

OTHER PUBLICATIONS

Journal of Applied Physics; T. Shibata, J. F. Gibbons, J. Kwo, R. D. Feldman and T. H. Geballe; vol. 52, p. 1537 (1981).
Applied Physics Letters; A. I. Brazinski, J. R. Gavaler, R. C. Kuzuicki, B. R. Appleton and C. W. White; vol. 39, p. 277 (1981).

Primary Examiner—L. Dewayne Rutledge
Assistant Examiner—S. Kastler
Attorney, Agent, or Firm—Oblon, Fisher, Spivak, McClelland & Maier

[57] ABSTRACT

A powder having a predetermined composition is filled in a tube. The tube is drawn to obtain a wire and the wire is rolled to obtain a tape-like starting body. Then, a laser beam is irradiated on the part of the tape to heat and melt the part of the tape. The starting body is rapidly heated and then cooled, thereby the part of the starting body is melted and solidified to form a compound superconductor layer.

51 Claims, 6 Drawing Sheets

METHOD OF MANUFACTURING COMPOUND SUPERCONDUCTORS

BACKGROUND OF THE INVENTION

The present invention relates to a method of manufacturing compound superconductors, such as A-15, Chevrel, and B-1 type compound superconductors.

Commercially available compound superconductors are $Nb_3Sn$ and $V_3Ga$. These superconductors are prepared by surface diffusion or a composite treatment which utilizes diffusion reactions between metal elements. Upper critical magnetic field of these compound superconductors are as low as about 20 tesla (T).

Examples of compound superconductors prepared on the experimental basis are $Nb_3Al$, $Nb_3Ga$, $Nb_3Ge$, $Nb_3(AlGe)$ and the like of A-15 type compound superconductors, $PbMo_6S_8$ and the like of Chevrel type compound superconductors, and NbN and the like of B-1 type compound superconductors. Among the three types of compound superconductors, $Nb_3Al$, $PbMo_6S_8$ and NbN have critical temperatures of 18.9° K., 14.4° K. and 17.3° K., and critical fields of 30 T, 50 to 60 T and 30 to 50 T, respectively. Thus, they have better superconducting properties than existing commercial available superconductors.

If the A-15, Chevrel and B-1 type compound superconductors, however, are to be prepared by surface diffusion, their particle size is increased due to the high diffusion temperature required. As a result, when a resultant superconductor is used to form a superconductor magnet, its most significant characteristic, i.e., a critical current density, is greatly reduced.

The compound superconductors can also be prepared by vapor deposition such as sputtering or CVD. According to such a method, however, the compound superconductors are prepared on only the experimental level due to a low deposition rate. Maximum dimensions of a resultant superconductor are a width of 1 cm, a length of several centimeters, and a thickness of about 2 to 3 μm atmost. Although a superconductor tape having a length of several meters was reported, it had variations in superconducting characteristics along its longitudinal direction and could not be used in practical applications. According to the above conventional methods of manufacturing compound superconductors, it is difficult to manufacture a long superconductor tape. In addition, good superconductive characteristics can only be obtained if the thickness is only about 2 to 3 μm. As a result, critical current Ic is as low as several 100 mA.

Niobium nitride (NbNx) can also be manufactured by thermal diffusion. An Nb body such as an Nb tape or wire is annealed in an annealing furnace in an $N_2$ gas atmosphere to react Nb with N, thereby preparing NbN. However, a superconductor having good superconducting characteristics has an NaCl type (B-1) crystal structure, and is an NbN-δ phase having a 1:1 ratio of Nb to N. The δ-phase is a nonequilibrium phase, existing stably only at a high temperature of 1,300° C. or higher. For this reason, NbN which has neither the 1:1 ratio of Nb to N nor the NaCl type crystal structure tends to be undesirably prepared. As a result, the resultant superconducting characteristics are unsatisfactory.

Sputtering is known as a method suitable for preparing an NbN nonequilibrium phase. According to this method, an Nb target and a substrate are placed in a vacuum chamber. The vacuum chamber is evacuated to a vacuum of $10^{-6}$ to $10^{-7}$ Torr. Ar and $N_2$ gases are supplied to the vacuum chamber at a pressure of $10^{-1}$ to $10^{-3}$ Torr and RF power is supplied between the Nb plate and the substrate to generate Ar and $N_2$ gas plasmas. Ar ions are then sputtered to remove Nb atoms from the Nb target. The Nb atoms react with N until the atoms reach the substrate, thereby forming an NbN film on the substrate. An NbN-δ phase film having good superconducting characteristics can thus be obtained.

With sputtering, however, using a vacuum chamber degrades productive efficiency. In addition, the shape of an NbN film formed is limited. It is difficult to form samples of a long wire or of a large area. Furthermore, since the NbN film formation rate is low, a long period of time is required.

SUMMARY OF THE INVENTION

It is an object of the present invention to provide a method of easily and stably manufacturing long or large A-15, Chevrel, and B-1 type compound superconductors with good superconducting characteristics, high critical temperatures, and high critical magnetic field without impairing the superconducting characteristics.

A method of manufacturing a compound superconductor according to the present invention comprises the first step of preparing a starting body having a composition of a compound superconductor to be manufactured and the second step of irradiating a laser beam on at least part of the starting body to heat and melt the starting body, thereby producing a layer of the compound superconductor in the starting body.

According to the present invention, powders containing components of the compound superconductor to be manufactured are mixed to obtain a predetermined composition. Or a powder molded or sintered body obtained by using some of the components is dipped in a solution containing the components so that the molded or sintered body is impregnated with the solution. Thus a starting body for the compound superconductor is prepared. The starting body is then irradiated with a laser beam to heat and melt at least part of the starting body. Superconductor components are combined with the melted portion of the starting body, and are solidified to form a compound layer of a predetermined composition. Therefore, a superconductor layer having uniform and good superconducting characteristics can be formed.

DETAILED DESCRIPTION OF THE PREFERRED EMBODIMENTS

Figure 1:
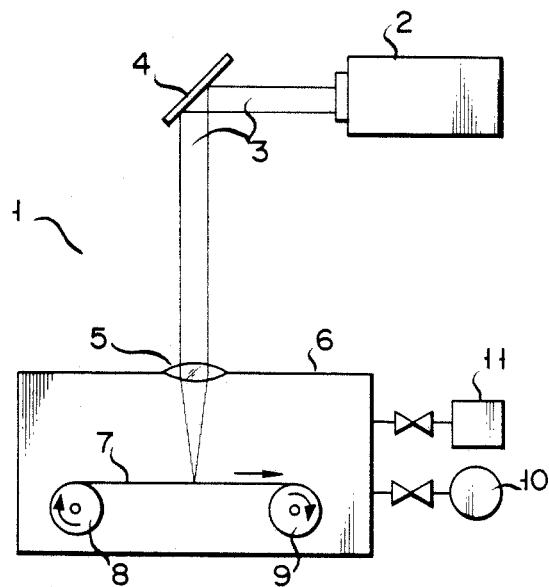
FIG. 1 is a diagram showing an embodiment of the present invention.

A first embodiment of the present invention will be described. In this embodiment, a starting body for an A-15, Chevrel, or B-1 type compound superconductor is prepared in the first step. In the second step, the body is irradiated with a laser beam to melt at least part of the body, and a compound superconductor layer is then formed in the body.

More specifically, the body is irradiated with a laser beam in a vacuum or in Ar gas. A laser beam power density is $10^4$ W/cm$^2$ or higher. If the laser power density is less than $10^4$ W/cm$^2$, the body is neither sufficiently heated nor does reaction occur between the constituting elements. In this case, a compound superconductor cannot be obtained. In the second step, the body is preferably heat-treated before and after melting upon radiation of the laser beam, to obtain a better result. Heat-treatment helps improve the superconducting characteristics. In particular, heat-treatment prior to melting of the body upon radiation of the laser beam causes a preliminary reaction between the constituting elements, to assist formation of a superconductor when the body is melted upon irradiation of the laser beam. It should be noted that the heat-treatment temperature must fall within the range of 400° to 2,000° C. If the heat-treatment temperature is less than 400° C., the reaction between the constituting elements does not progress substantially. However, if the heat-treatment temperature exceeds 2,000° C., a compound other than the superconductor is undesirably formed. Heat-treatment after radiation of the laser beam improves crystallinity of the resultant compound, and helps improve the superconducting characteristics. In this case, the heat-treatment temperature must fall within the range between 300° to 1,500° C. When the heat-treatment temperature is less than 300° C, element diffusion substantially does not occur, and crystallinity cannot be improved. However, if the temperature exceeds 1,500° C., the crystal grains become coarse and the superconducting characteristics are degraded.

According to this embodiment, an A-15, Chevrel, or B-1 type compound superconductor having good superconducting characteristics can be easily prepared by rapid heating and cooling upon irradiation of the laser beam. More specifically, the molded body prepared in the first step of this embodiment is simply irradiated with a laser beam in the second step. The laser beam may be fixed while the molded body is moved at high speed or vice versa, thereby easily allowing the preparation of a long superconductive layer. In addition, a superconductor layer having a thickness of about several 100 $\mu$m can be formed by radiation of the laser beam. As a result, a superconductor having a sufficiently high critical current Ic can be obtained.

According to this embodiment, a long compound superconductor layer having a higher critical temperature Tc, critical magnetic field Bc$_2$, and critical current density Jc than those of existing commercially available compound superconductors such as Nb$_3$Sn and V$_3$Ga can be easily prepared. Therefore, the compound superconductor of this embodiment can contribute to a promising superconductor magnet for generating a stronger magnetic field. The conventional Nb$_3$Sn and V$_3$Ga superconductors are prepared by a composite treatment method which requires many operations such as drawing, extrusion, and intermediate annealing. In addition, a last process, i.e., thermal diffusion, requires several tens of hours to several hundreds of hours. However, according to the method of the present invention, the superconductor can be prepared by laser annealing in a short period of time, thereby greatly reducing the manufacturing cost.

Examples of the present invention will be described below.

EXAMPLE 1

99% pure Nb powder and 99.9% pure Al powder were mixed at a ratio of Nb-25at% Al to obtain a mixture for an A-15 type compound superconductor as sample No. 1. The mixture was filled in a Cu tube having an outer diameter of 10 mm and an inner diameter of 8 mm. Both open ends of the Cu tube were welded and sealed, and the Cu tube was drawn. The drawn wire was rolled to obtain a tape. The outer Cu tube was then removed by nitric acid. The resultant Nb-Al power mixture tape had a thickness of 0.5 mm and a width of 3 mm. The above process is the first step.

Samples having the compositions listed for Nos. 2 to 10 in Table 1 were also prepared in the same manner as above.

TABLE 1

| | Sample No. | 1 | 2 | 3 | 4 | 5 | 6 | 7 | 8 | 9 | 10 |
|---|---|---|---|---|---|---|---|---|---|---|---|
| a | Series Composition | Nb—Al Nb - 25 at % Al | Nb—Al Nb - 50 at % Nb$_2$Al | Nb$_2$Al - 50 at % NbAl$_3$ | Nb—Ga Nb - 25 at % Ga | Nb—Ga Nb - 25 at % Ge | Nb—Al—Ge Nb - 17.5 at % Al - 7.5 at % Ge | Nb—Al—Ge Nb - 25 at % (17.5 at % Al - 7.5 at % Ge) | V—Si V - 25 at % Si | Pb—Mo—S Pb - 50 at % MoS$_2$ | Sn—Mo—S Sn - 50 at % MoS$_2$ |
| b | Laser Power (kW) | 2.5 | 2.0 | 1.5 | 1.0 | 3.0 | 2.5 | 2.5 | 1.5 | 1.0 | 1.0 |
| | Tc (K) | 16.0 | 16.3 | 16.5 | 18.7 | 19.0 | 19.3 | 19.0 | 16.0 | 13.1 | 11.5 |
| | Ic at 17T (A) | 19.0 | 23.0 | 31.0 | 24.0 | 27.0 | 34.0 | 30.0 | 19.0 | 13.0 | 10.0 |
| c | Tc (K) | 17.0 | 17.1 | 17.3 | 19.7 | 20.2 | 20.5 | 20.0 | 16.5 | 13.5 | 11.9 |
| | Ic at 17T (A) | 23.0 | 22.0 | 34.0 | 28.0 | 29.0 | 36.0 | 32.0 | 21.0 | 15.0 | 13.0 |
| d | Tc (K) | 17.0 | 17.2 | 17.5 | 19.8 | 20.3 | 20.2 | 19.8 | 16.1 | 13.5 | 11.7 |
| | Ic at 17T (A) | 25.0 | 24.0 | 36.0 | 30.0 | 32.0 | 40.0 | 36.0 | 23.0 | 20.0 | 17.0 |
| e | Tc (K) | 17.5 | 17.3 | 17.8 | 20.0 | 20.7 | 20.5 | 20.2 | 16.7 | 13.7 | 12.0 |

TABLE 1-continued

| Sample No. | 1 | 2 | 3 | 4 | 5 | 6 | 7 | 8 | 9 | 10 |
|---|---|---|---|---|---|---|---|---|---|---|
| Ic at 17T (A) | 30.0 | 29.0 | 40.0 | 35.0 | 35.0 | 43.0 | 40.0 | 27.0 | 30.0 | 23.0 |

(Notes)
Column c represents values obtained when samples were heat-treated at 700° C. for 100 hours after laser radiation.
Column d represents values obtained when samples were heat-treated at 1,000° C. for 30 minutes and then irradiated with a laser beam.
Column e represents values obtained when samples were heat-treated at 1,000° C. for 30 minutes before laser radiation, and at 700° C. for 100 hours after laser radiation.

Samples in Nos. 1 to 10 were irradiated with a laser beam from laser generator 1 in FIG. 1 (the second step).

The arrangement of the laser generator will be briefly described below.

Referring to FIG. 1, reference numeral 2 denotes a $CO_2$ laser oscillator (a maximum output of 10 kW). Laser beam 3 from oscillator 2 is guided to vacuum chamber 6 through Cu reflecting mirror 4 and ZnSe lens 5. Supply drum 8 for supplying sample 7 and take-up drum 9 for taking up sample 7 are arranged in chamber 6. Sample 7 supplied from drum 8 is irradiated with beam 3 and is then taken up by drum 9. Chamber 6 can be selectively connected to vacuum pump 10 or Ar gas tank 11.

Figure 2:
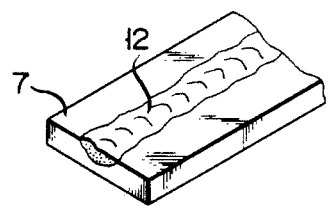
FIG. 2 is a perspective view showing a compound superconductor manufactured by the embodiment of the present invention.

Laser beam radiation on the sample 7 was performed in the following manner. Sample 7 was set in drums 8 and 9, chamber 6 was evacuated to a vacuum of $10^{-5}$ Torr, and Ar gas was supplied to chamber 6 to keep it at atmospheric pressure. Sample 7 was irradiated with beam 3 (with beam spot diameter of 1 mm), having the power indicated in Table 1, while sample 7 was taken up by drum 9 at a rate of 10 m/min. After laser radiation, i.e., after radiation of the laser beam having a power density of $3.1 \times 10^5$ W/cm$^2$ (i.e., a power of 2.5 kW), compound superconductor 12 having a width of 0.5 mm and a depth of about 0.1 mm was formed on the upper surface of each sample 7, as shown in FIG. 2. The surface of layer 12 was like that of a welded surface.

Critical temperatures Tc and critical currents Ic at 17 T of the respective samples, each with the compound superconductor layer, were measured and the results are shown in column b of Table 1. As is apparent from these results, the respective samples have sufficiently high Tc and Ic of 10 A or more. If this value is converted to critical current density Jc, Jc is as high as $2 \times 10^4$ A/cm$^2$. Compare this to the Ic (a maximum of several 100 mA) of a compound superconductor prepared by the conventional vapor deposition method. As is apparent, the current density of the superconductor according to Example 1 can be increased by 100 times or more when compared to the current density of the conventional compound superconductor.

The superconducting characteristics of each sample along its longitudinal direction were examined. The same characteristics as in column b of Table 1 were confirmed for a length range of 30 to 100 m. Therefore, according to the method of this embodiment, a long compound superconductor having sufficiently high Tc and Ic can be easily prepared. A 20 T or more of a superconductor magnet which could not be realized by the conventional superconductors can be achieved using the compound superconductor prepared by the method of this embodiment.

Part of each sample was annealed at a temperature of 700° C. for 100 hours after it was irradiated with the laser beam. The results are shown in column c of Table 1. $T_c$ of each sample was increased by about 1° K. In addition, an increase in Ic at 17 T was also found.

Part of each sample was annealed at a temperature of 1,000° C. for 30 minutes prior to radiation of the laser beam. Tc and Ic of the irradiated portion of each sample were measured and were found to be increased, as shown in column d of Table 1.

In addition, part of each sample in column d of Table 1 was annealed at a temperature of 700° C. for 100 hours. The results in column e of Table 1 were obtained. Tc and Ic of the annealed portion of each sample were increased. Therefore, annealing before and after laser beam radiation was found to be effective. EXAMPLE 2

Following the procedures in the first step in Example 1, Nb, V, and Mo tubes were used for Nb base A-15 type compound, for V base A-15 type compound and for Mo base Chevrel type compound, respectively. The mixtures were filled in the tubes, as in Example 1. The open ends of the tubes were sealed, and the tubes were drawn and rolled to obtain tapes. The tapes were irradiated with the laser beam without removing the outer tubes. The characteristics of the samples were examined to obtain the same results as in column b of Table 1. According to this method, the step of removing the tube can be eliminated to further reduce the manufacturing cost. EXAMPLE 3

Figure 3:
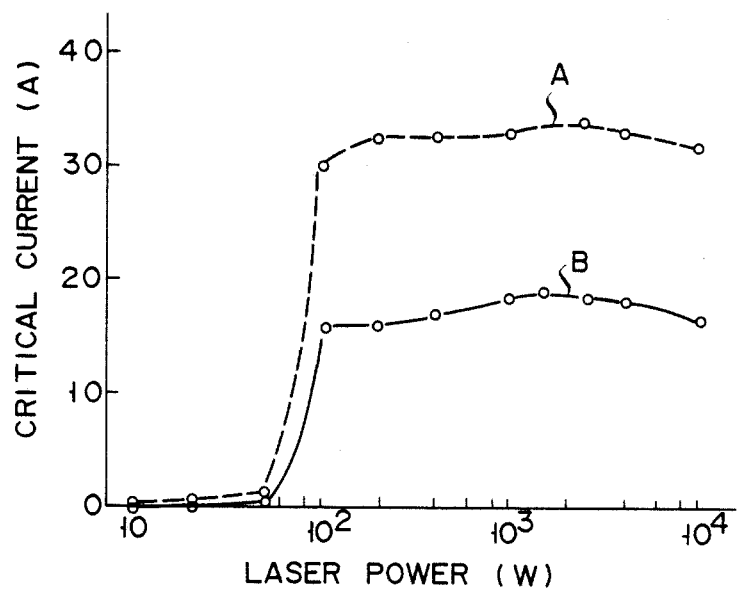
FIG. 3 is a graph showing a relation-ship between a laser power and a critical current.

11 samples of sample No. 7 (Nb-17.5 at % Al-7.5 at% Ge) and 11 samples of No. 8 (V-25 at % Si) in column a of Table 1 were prepared. These samples were irradiated with laser beams of 10 W to 10 kW. Critical currents Ic of these samples at 17 T were measured to check Ic dependency on the laser power. The results are shown in FIG. 3. Curve A in FIG. 3 is for Nb-Al-Ge samples, and B, for V-Si samples. As is apparent from FIG. 3, in order to obtain higher critical currents Ic, a laser power of 100 W or higher is required. In Example 3, a $CO_2$ laser oscillator of a maximum output of 10 kW was used. For this reason, the samples could not be irradiated with a laser beam having a power of higher than 10 kW. However, the same good characteristics can be expected with a power of 10 kW or higher. EXAMPLE 4

Figure 4:
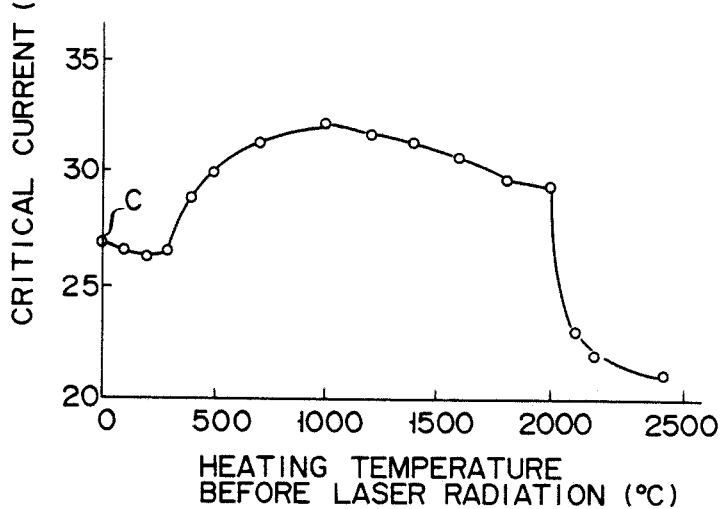
FIG. 4 is a graph showing a relation-ship between a heat treatment temperature before laser irradiation and a critical current.

15 samples of sample No. 5 (Nb-25 at% Ge) in column a of Table 1 were prepared. The samples were annealed at different temperatures within the range of 100 to 2,500° C. for 30 minutes prior to the laser irradiation. The preheated samples were irradiated with a laser beam of 3 kW to obtain 15 compound superconductors. Critical currents Ic of these superconductors were measured at 17 T to check Ic dependency on heat-treatment temperature prior to laser radiation. The results are shown in FIG. 4. Curve C in FIG. 4 represents the results of a superconductor of the same composition as described above, but without the above preheating. As is apparent from FIG. 4, it is found that an effective preheating temperature range prior to laser irradiation is 400° to 2,000° C. EXAMPLE 5

Figure 5:
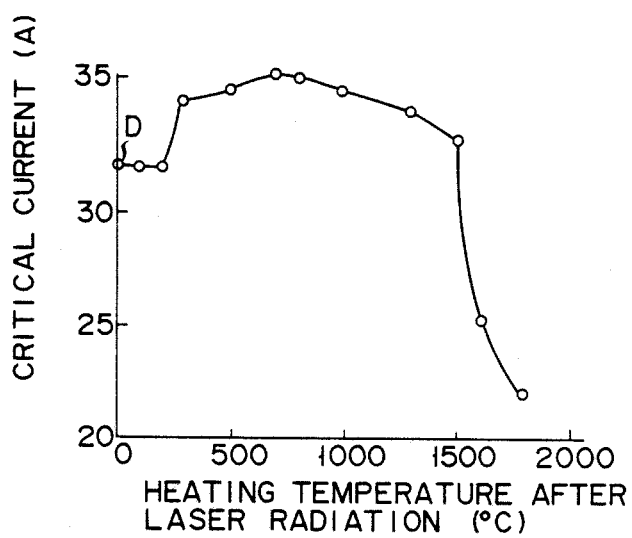
FIGS. 5 and 6 are graphs showing a relation-ship between a heat treatment temperature after laser irradiation and a critical current.

11 samples of the same composition as that (Nb-25 at % Ge) in Example 4 were prepared and annealed at a temperature of 1,000° C. for 30 minutes. The annealed samples were irradiated with a laser beam having a power of 3 kW. The irradiated samples were then annealed again at different temperatures in the range of 100° to 1,800° C. for 100 hours. Critical currents Ic of the 11 resultant superconductors at 17 T were measured, and the results are shown in FIG. 5. Curve D shows the results of the superconductor of the same composition as described above, but without the above postheat treatment after the laser radiation. As is apparent from FIG. 5, it is found that an effective heating temperature range is 300° to 1,500° C. EXAMPLE 6

Figure 6:
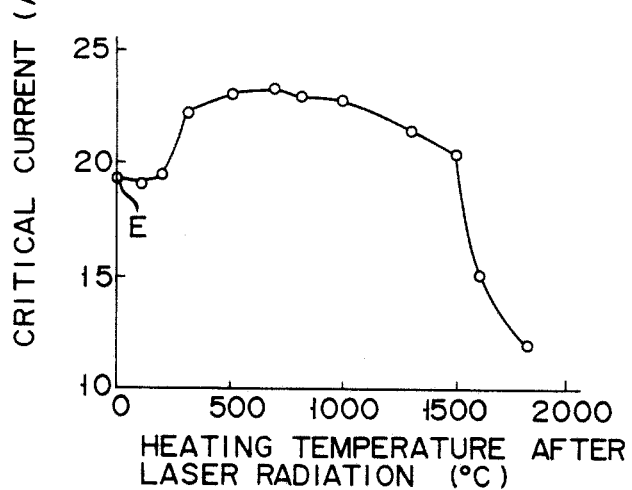

11 samples of the same material as that (Nb-25 at % Al) of sample No. 1 in column a of Table 1 were prepared. The samples were irradiated with a laser beam having a power of 2.5 kW and annealed at different temperatures within the range of 100° to 1,800° C. for 100 hours. Currents Ic of the 11 resultant superconductors were measured at 17 T, and the results are shown in FIG. 6. Curve E represents the results of the superconductor of the same composition as described above, but without the above postheating after laser radiation. As is apparent from FIG. 6, it is found that an effective heat-treatment temperature range is 300° to 1,500° C.

In the first embodiment described above, the compositions in column a of Table 1 were prepared in the first step as starting materials for the A-15 or Chevrel type compound superconductors. However, the compositions are not limited to the ones listed. Other examples of a starting material that can be prepared in the first step are (1) a mixture of one powder selected from Nb and V, and at least one powder selected from Al, Ge and Si, (2) a mixture of an Nb powder and a powder of an alloy or a compound which contains at least two elements selected from Nb, Al, Ge, Ga, and Si, (3) a mixture of V powder and a powder of an alloy or a compound which contains at least two elements selected from V, Al, Ge, Ga, and Si, (4) at least one powder selected from an alloy and a compound which contain Nb and at least one element selected from Al, Ge, Ga, and Si, (5) at least one powder selected from an alloy and a compound which contain V and at least one element selected from Al, Ge, Ga, and Si, (6) a mixture of: at least one powder selected from an alloy and a compound which contain Nb and at least one element selected from Al, Ge, Ga, and Si; and at least one powder selected from Al, Ge, Ga, and Si, or a powder of an alloy or a compound which contains at least two elements selected from Al, Ge, Ga, and Si, (7) a mixture of: at least one powder selected from an alloy and a compound which contain V and at least one element selected from Al, Ge, Ga, and Si; and at least one powder selected from Al, Ge, Ga, and Si, or an alloy or a compound which contains at least two elements selected from Al, Ge, Ga, and Si, (8) a mixture of metal M (M is one element selected from Pb Sn, Cu, and Ag) powder, Mo powder, and S powder, (9) a mixture of sulfide powder of metal M (M is an element selected from Pb, Sn, Cu, and Ag), and Mo powder, (10) a mixture of sulfide powder of metal M (M is an element selected from Pb, Sn, Cu, and Ag), Mo powder, and at least one powder selected from the metal M powder and S powder, (11) a mixture of at least one powder selected from metal M (M is one element selected from Pb, Sn, Cu, and Ag) powder and sulfide powder of metal M, and Mo sulfide powder, (12) a mixture of: at least one powder selected from metal M (M is one element selected from Pb, Sn, Cu, and Ag) powder and sulfide powder of metal M; Mo sulfide powder; and at least one powder selected from Mo powder and S powder, (13) a mixture of: at least one powder selected from S powder, sulfide powder of metal M (M is one element selected from Pb, Sn, Cu, and Ag) and Mo sulfide powder; and a powder of an alloy or compound which contains metal M and Mo, (14) a mixture of: at least one powder selected from S powder, sulfide powder of metal M (M is one element selected from Pb, Sn, Cu, and Ag), and Mo sulfide powder; a powder of an alloy or compound which contains metal M and Mo; and at least one powder selected from metal M powder and Mo powder, (15) a ternary compound of metal M (M is an element selected from Pb, Sn, Cu, and Ag), Mo, and S; or a mixture of the ternary powder and at least one powder selected from metal M powder, Mo powder, S powder, a powder of an alloy or compound which contains metal M and Mo, sulfide powder of metal M, and Mo sulfide powder, (16) a mixture obtained by substituting sulfide powders of metal M in (9) to (15) with at least two metal M sulfide powders of different compositions, (17) a mixture obtained by substituting Mo sulfides in (11) to (15) with at least two Mo sulfides of different compositions, and (18) a mixture obtained by substituting the M-Mo-S compound in (15) with at least two M-Mo-S compounds of different compositions.

A second embodiment of the present invention will be described below. In this embodiment, a powder molded or sintered body which contains at least one of the components constituting a superconductor to be obtained is prepared in the first step. The molded or sintered body is dipped in a melt containing the remaining components constituting the superconductor to be obtained, and the molded or sintered body is impregnated with the melt. When the melt is solidified, a starting body having the composition of the compound superconductor to be obtained is prepared.

The second embodiment will be described in more detail.

First Step

For Manufacture of A-15 Compound Superconductor

Using a powder containing niobium as a major constituent or a plurality of wires containing niobium as a major constituent, a sintered body having a predetermined shape is prepared. Alternatively, the powder is molded under pressure to prepare a molded body. "Niobium as a major constituent" means pure niobium and the material which contains at least one of aluminum, germanium and gallium. It should be noted that the sintered or molded body must have a higher melting point than that of the melt.

The sintered or molded body is dipped in a melt containing at least one of aluminum, germanium, and allium to prepare a starting body. In this case, the ratio of the melt in the starting body is preferably 5 to 50% by volume. When the content of the solution is excessively small, laser radiation on the starting body in the second step does not cause formation of an A-15 type compound superconductor. However, when the content of the solution is excessively large, compounds other than the A-15 type compound are formed to greatly degrade the superconducting characteristics. In order to control the content of the melt in the starting body, the sintering or compressing conditions of the sintered or molded body are changed to obtain a desired porosity.

The sintered or molded body is inserted in a niobium tube before or after it is dipped in the melt, so as to achieve better workability in the subsequent process.

For Manufacture of Chevrel Compound Superconductor

A sintered or molded body is prepared using at least one powder selected from the group consisting of M (M is one metal element selected from lead, tin, copper, and silver), M sulfide, sulfur, molybdenum, and molybdenum sulfide. The sintered or molded body is dipped in a solution containing at least one element selected from the above group, and having a melting point lower than that of the sintered or molded body. The solution is permeated in the pores of the sintered or molded body and is solidified to prepare the starting body.

More specifically, M powder, M sulfide powder or a mixture thereof is mixed with Mo powder, Mo sulfide powder, or a mixture thereof to prepare the sintered or molded body. The body is dipped in a sulfur solution to prepare a starting body. Alternatively, a sintered or molded molybdenum sulfide powder body is impregnated with a solution of metal M, which is then solidified to prepare a starting body. Otherwise, one powder selected from metal M sulfide powder, molybdenum powder, and a mixture thereof is added to molybdenum sulfide powder to prepare a sintered or molded body. The body is impregnated with a solution of metal M, which is then solidified to prepare a starting body.

The sintered or molded body is preferably inserted in a molybdenum tube before or after it has been impregnated with the solution, so as to achieve better workability in the subsequent process.

Second Step

The starting body prepared in the first step is irradiated with a laser beam in a vacuum or in Ar gas. A power density of the laser beam is set to be $10^4$ W/cm$^2$ or more on the irradiated portion. When the laser power is less than $10^4$ W/cm$^2$, the sample is neither heated sufficiently nor do the constituting elements react with each other. Therefore, the compound superconductor cannot be formed. In the second step, when the sample is heat-treated before and after the laser beam radiation, good results can be obtained. Heat-treatment helps improve the superconducting characteristics. Preheat-treatment prior to laser beam radiation causes preliminary reaction between the constituting elements, to assist formation of a superconductor upon irradiation of the laser beam. In this case, a heat-treatment temperature range must be set to be 400° to 2,000° C., and preferably 800° to 1,500° C. If the heat-treatment temperature is less than 400° C., the constituting elements do not substantially react each other. However, if the heat-treatment temperature exceeds 2,000° C., compounds other than the superconductor are undesirably formed. Postheating after laser beam irradiation improves crystallinity of the compound formed by laser radiation, thereby improving the superconducting characteristics In this case, the heat-treatment temperature must fall within the range of 300° to 1,500° C., and preferably 500° to 1,000° C. If the heat-treatment temperature is less than 300° C., the elements do not substantially diffuse, therefore failing to improve the crystallinity. However, if the heat-treatment temperature exceeds 1,500° C., the crystal grain size is excessively increased, adversely degrading the superconducting characteristics.

According to the method of this embodiment, an A-15, Chevrel, or B-1 type compound superconductor having good superconducting characteristics can be easily prepared by rapid heating and cooling with radiation of the laser beam. In particular, according to this method, the solution is permeated in the sintered or molded body, and is solidified to prepare a starting body. Therefore, adhesion of the components constituting the starting body can be improved and therefore, the superconducting characteristics of the resulting compound can be improved. In the second step, the starting body prepared in the first step is irradiated with a laser beam. The laser beam is fixed while the sintered or molded body is moved at high speed. Alternatively, the sintered or molded body is fixed while the laser beam is scanned at high speed. A long superconductor can thus be easily prepared. Since a superconductor having a thickness of several 100 μm can be formed upon irradiation of the laser beam, a superconductor having a sufficiently high critical current Ic can be prepared.

According to the method of this embodiment, the compound superconductor having a higher critical temperature Tc, higher upper critical magnetic field Bc2, and high critical current density Jc can be obtained, when compared to existing superconductors, such as Nb$_3$Sn and V$_3$Ga, and a long sample of compound superconductors can be easily manufactured. Therefore, a superconducting magnet for generating a higher magnetic field can be formed using the compound superconductor of this embodiment. The conventional Nb$_3$Sn and V$_3$Ga superconductors prepared by the fabrication require many steps such as drawing, extrusion, and intermediate annealing. In addition, a final diffusion process requires several tens of hours to several hundreds of hours. However, according to the method of this embodiment, a superconductor can be prepared in a short period of time upon radiation of the laser beam, thus greatly reducing the manufacturing cost.

Examples of this embodiment will be described below. EXAMPLE 7

This example is for manufacture of A-15 Compound Superconductor 200 g of Nb powder having a 99% purity and a particle size of 100 μm were compressed and molded. The molded body was sintered at a temperature of 2,200° C. for an hour. The sintered body was then dipped in an aluminum bath of about 800° C., and an aluminum melt infiltrated in the pores of the sintered body and solidified to prepare a starting body. In this case, the ratio of aluminum in the starting body was 20% by volume. The resultant body was inserted in an Nb tube, and was drawn and rolled to obtain a tape having a width of 4 mm and a thickness of 200 μm (sample No. 21). Four other starting bodies (sample Nos. 22 to 25) were prepared in the same manner as above, except for changing solution materials (column a of Table 2).

TABLE 2

| | Sample No. | 21 | 22 | 23 | 24 | 25 |
|---|---|---|---|---|---|---|
| a | Series Sintered Body | Nb—Al | Nb—Ga | Nb—Ge | Nb—Al—Ga Nb Powder | Nb—Al—Ge |
| | Solution | Al | Ga | Ge | Al - 10 at % Ga | Al - 10 at % Ge |
| b | Laser Power* | $3.1 \times 10^5$ | $2.5 \times 10^5$ | $3.8 \times 10^5$ | $3.1 \times 10^5$ | $3.1 \times 10^5$ |

TABLE 2-continued

| Sample No. | | 21 | 22 | 23 | 24 | 25 |
|---|---|---|---|---|---|---|
| Density (W/cm²) | | | | | | |
| | Tc (K) | 16.0 | 18.5 | 19.0 | 18.3 | 19.0 |
| | Ic: 17T (A) | 17.0 | 20.0 | 14.0 | 16.0 | 17.0 |
| c | Tc (K) | 17.8 | 19.8 | 20.3 | 19.5 | 20.1 |
| | Ic: 17T (A) | 23.0 | 25.0 | 19.0 | 23.0 | 25.0 |
| d | Tc (K) | 17.5 | 19.7 | 20.1 | 19.3 | 20.0 |
| | Ic: 17T (A) | 22.0 | 23.0 | 18.0 | 22.0 | 23.0 |
| e | Tc (K) | 18.0 | 20.1 | 20.7 | 19.8 | 20.2 |
| | Ic: 17T (A) | 28.0 | 27.0 | 20.0 | 26.0 | 30.0 |

(Notes)
*A laser beam diameter was 1 mm.
Column c represents values obtained when samples were heated at 700° C. for 100 hours after laser irradiation.
Column d represents values obtained when samples were heated at 1,000° C. for 30 minutes and then irradiated with a laser beam.
Column e represents values obtained when samples were heated at 1,000° C. for 30 minutes before laser irradiation, and at 700° C. for 100 hours after laser irradiation.

The prepared samples were irradiated with a laser beam to form corresponding compound superconductor layers. Laser generator 1 used in Example 7 is the same as that in FIG. 1.

Critical temperatures Tc and critical currents Ic at 17 T of the resultant compound superconductor layers were measured, and the results are shown in column b of Table 2. As is apparent from Table 2, Tc of each sample was sufficiently high, and Ic was as high as 10 A or more. Ic value converted to critical current density Jc was as large as $4 \times 10^4$ A/cm² or more. Critical current Ic of the compound superconductor prepared by the conventional vapor deposition method is a maximum of several 100 mA. Therefore, the critical current density of the superconductor of Example 7 is increased 100 times or more.

The characteristics of the respective samples along their longitudinal direction (30 cm) were confirmed to be the same as those in column b of Table 2. Therefore, according to the method of this embodiment, a long compound superconductor having sufficiently high Tc and Ic can be easily prepared. A 20 T or more of a superconductor magnet which could not be realized by the conventional superconductors can thus be achieved using the compound superconductor prepared by the method of this embodiment.

Part of each sample was annealed at a temperature of 700° C. for 100 hours after it was irradiated with the laser beam. The results are shown in column c of Table 2. Tc of each sample was increased by about 1 K. In addition, an increase in Ic at 17 T was also found.

Part of each sample was annealed at a temperature of 1,000° C. for 30 minutes prior to irradiation of the laser beam. Tc and Ic of the irradiated portion of each sample were measured and were found to be increased, as shown in column d of Table 2.

Moreover, part of each sample was irradiated with a laser beam at a temperature of 700° C. for 100 hours, after the results in column d of Table 2 were obtained. Tc and Ic of the annealed portion of each sample were found to be increased, as shown in column e of Table 2. Therefore, annealing before and after laser beam irradiation was found to be effective.

EXAMPLE 8

800 Nb wires having a 99% purity and a diameter of 300 μm were bundled and inserted in an Nb tube, and were heated at a temperature of 2,200° C. for an hour to sinter the Nb wires. The sintered body was dipped in a bath of Al-10 at% Ge at a temperature of 800° C., and pores of the sintered body were impregnated with a melt of Al-Ge alloy. The melt was then solidified to prepare a starting body. In this case, the ratio of the Al-Ge alloy in the starting material was 20% by volume. The resultant body was drawn and rolled to prepare a tape having a width of 7 mm and a thickness of 0.2 mm.

The tape body was irradiated with a laser beam having a power density of $3.1 \times 10^5$ W/cm² (a power of 2.5 kW and a beam spot diameter of 1 mm).

Tc and Ic at 17 T of the resultant sample were measured to be 17.0 K and 22 A, respectively. The sample was further heated at a temperature of 700° C. for 100 hours. Tc and Ic at 17 T were found to be increased to 19.2 K and 25 A, respectively.

Even if the Nb powder in Example 7 was used in place of the Nb wires, good superconducting characteristics upon radiation of the laser beam were obtained.

EXAMPLE 9

In the step of preparing the sintered bod in Example 8, the number of Nb wires was changed to prepare different samples having 2 to 65% by volume of the Al-10 at% Ge alloy. The % by volume was calculated by observing sample sections with an optical microscope.

Figure 7:
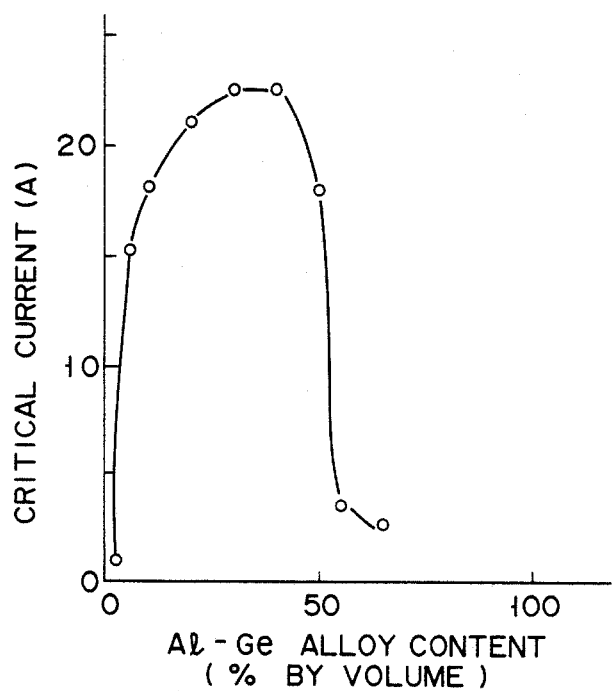
FIG. 7 is a graph showing a relation-ship between an Al-Ge alloy content (% by volume) and a critical current.

The samples were irradiated with a laser beam having a power density of $3.1 \times 10^5$ W/cm² (a power of 2.5 kW and a beam spot diameter of 1 mm). Critical currents Ic of the samples at 17 T were measured to examine influences of a ratio of Nb to Al-Ge alloy on Ic at 17 T. As shown in FIG. 7, a high Ic can be obtained when the content of Al-Ge alloy is 5 to 50% by volume, indicating that A-15 compound superconductors within this range can have good superconducting characteristics.

EXAMPLE 10

This example is for manufacture of Chevrel Compound Superconductor 40 g of Pb powder having a 99% purity and a particle size of 100 μm, and 160 g of Mo powder having a 99.9% purity and a particle size of 10 μm were mixed, and the mixture was compressed and molded. The molded body was sintered at a temperature of 300° C. for 5 hours. The sintered body was then dipped in a sulfur bath and was impregnated with sulfur. The sulfur melt was solidified and the resultant body was drawn and rolled to obtain a tape having a width of 4 mm and a thickness of 200 μm (sample No. 26). Other tapes, (sample Nos. 27 to 30) were prepared in the same manner as sample No. 26, except that materials of the sintered bodies and melts were different (column a of Table 3).

cient superconducting characteristics can be obtained with a power density exceeding $1.2 \times 10^6$ W/cm 2.

TABLE 3

| | Sample No. | 26 | 27 | 28 | 29 | 30 |
|---|---|---|---|---|---|---|
| a | Series | Pb—Mo—S | Pb—Mo—S | Sn—Mo—S | Sn—Mo—S | Cu—Mo—S |
| | Sintered Body | Pb powder + Mo powder | Mo powder + $MoS_2$ powder | Sn powder + Mo powder | Mo powder + $MoS_2$ powder | Cu powder + $MoS_2$ powder |
| | Solution | S | Pb | S | Sn | S |
| b | Laser Power* Density (W/cm$^2$) | $1.2 \times 10^5$ | $1.2 \times 10^5$ | $1.2 \times 10^5$ | $1.2 \times 10^5$ | $1.2 \times 10^5$ |
| | Tc (K) | 13.0 | 13.1 | 11.0 | 11.2 | 10.0 |
| | Ic: 17T (A) | 12.0 | 12.5 | 10.0 | 11.0 | 10.0 |
| c | Tc (K) | 13.5 | 13.4 | 11.3 | 11.5 | 10.3 |
| | Ic: 17T (A) | 15.0 | 16.0 | 13.0 | 14.0 | 13.0 |
| d | Tc (K) | 13.5 | 13.3 | 11.3 | 11.4 | 10.1 |
| | Ic: 17T (A) | 14.0 | 13.0 | 12.0 | 12.0 | 11.0 |
| e | Tc (K) | 13.8 | 13.9 | 11.9 | 11.7 | 10.5 |
| | Ic: 17T (A) | 16.0 | 17.0 | 15.0 | 15.0 | 14.0 |

(Notes)
*A laser beam diameter was 1 mm.
Column c represents values obtained when samples were heated at 500° C. for 100 hours after laser irradiation.
Column d represents values obtained when samples were heated at 1,000° C. for 30 minutes and then irradiated with a laser beam.
Column e represents values obtained when samples were heated at 1,000° C. for 30 minutes before laser irradiation, and at 500° C. for 100 hours after laser irradiation.

The samples were irradiated with a laser beam, as in Example 7, to form compound superconductor layers. Critical temperatures Tc and critical currents Ic at 17 T of these compound superconductor layers were measured, and the results are shown in column b of Table 3. Sufficiently high Tc and Ic are obtained for each sample. The irradiated reaction portion of each sample had a width of 0.5 mm and a depth of 0.1 mm, in the same manner as in Example 7, so that Jc was $4 \times 10^4$ A/cm$^2$ or higher.

The influences of heat-treatment before and after laser irradiation were examined, as in Example 7. Column c of Table 3 shows the results when the samples were heated at a temperature of 500° C. for 100 hours after the laser radiation. Column d of Table 3 shows the results when the samples were heated at a temperature of 1,000° C. for 30 minutes before the laser irradiation. Column e of Table 3 shows the results when the samples of column d were heated at a temperature of 500° C. for 100 hours after laser irradiation.

In any of the above, increases in Tc and Ic were found. It is thus confirmed that heat-treatment before and after laser irradiation is effective.

EXAMPLE 11

Figure 8:
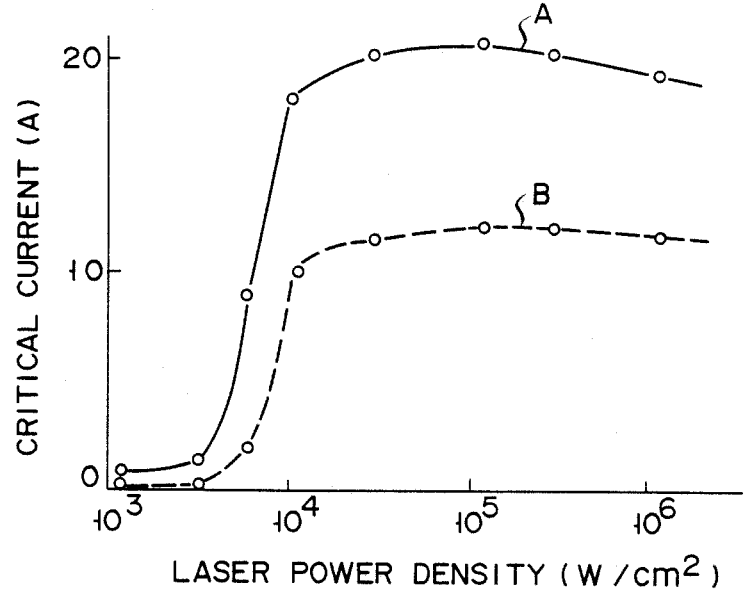
FIG. 8 is a graph showing a relation-ship between a laser power density and a critical current.

8 samples of sample No. 12 (Nb-Ga) in column a of Table 2, and 8 samples of sample No. 26 (Pb-Mo-S) in column a of Table 3 were prepared. These samples were irradiated with different laser beams having a power density range of $1.0 \times 10^3$ to $1.2 \times 10^6$ W/cm$^2$. In this case, a beam spot diameter was 1 mm. Critical currents Ic at 17 T were measured to examine the laser power density dependency of Ic. As shown in FIG. 8, in order to obtain a high Ic, a laser power density of $10^4$ W/cm$^2$ or more is required. Curve A in FIG. 8 represents niobium-gallium; and B, Pb-Mo-S. In Example 11, since a $CO^2$ laser oscillator having a maximum output of 10 kW was used, the samples could not be irradiated with a laser beam having a power density exceeding $1.2 \times 10^6$ W/cm$^2$ (a power of 10 kW and a beam spot diameter of 1 mm) As is apparent from the results in FIG. 8, sufficient superconducting characteristics can be obtained with a power density exceeding $1.2 \times 10^6$ W/cm 2.

EXAMPLE 12

Figure 9:
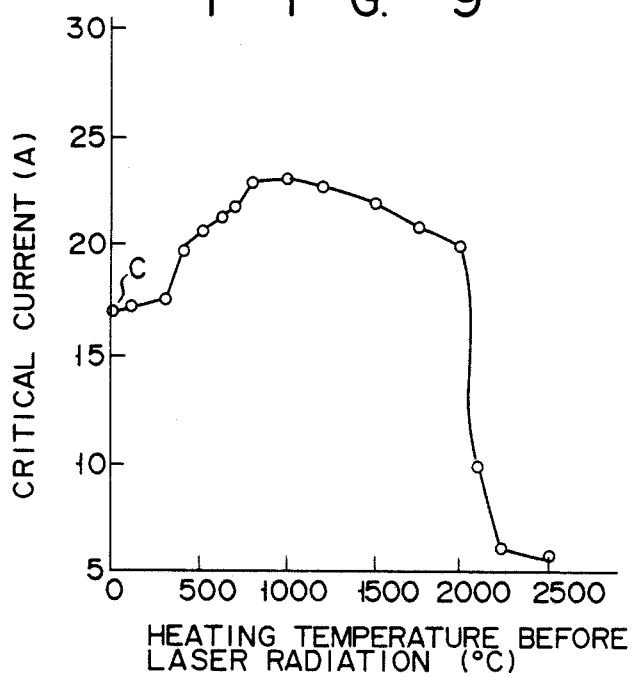
FIG. 9 is a graph showing a relation-ship between a heat treatment temperature before laser irradiation and a critical current.

15 samples of sample No. 15 (Nb-Al-Ge alloy) in column a of Table 2 were prepared, and were heated at different temperatures in the range of 100° to 2,500° C. for 30 minutes. The resultant samples were irradiated with a laser beam having a power density of $3.1 \times 10^5$ W/cm$^2$ (a power of 2.5 kW and a beam spot diameter of 1 mm) to obtain compound superconductor films. Critical currents Ic of these films at 17 T were measured to examine the heat-treatment temperature dependency of Ic. The results are shown in FIG. 9. The results for a superconductor film of the same composition as described above but without heat-treatment are represented by curve C.

As is apparent from FIG. 9, it is found that an effective heat-treatment temperature range prior to laser radiation is 400° to 2,000° C. and preferably 800° to 1,500° C.

EXAMPLE 13

Figure 10:
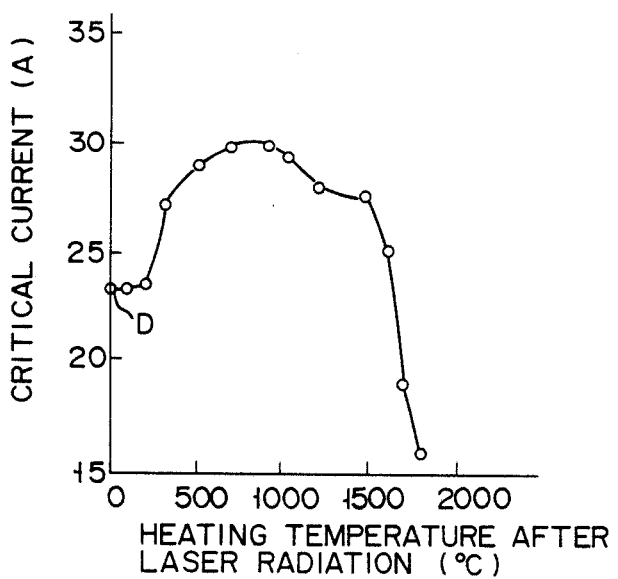
FIGS. 10 and 11 are graphs showing a relation-ship between a heat treatment temperature after laser irradiation and a critical current.

12 samples as in Example 12 were prepared and heated at a temperature of 1,000° C. for 30 minutes. The samples were irradiated with a laser beam having a power density of $3.1 \times 10^5$ W/cm$^2$ (a power of 2.5 kW and a beam spot diameter of 1 mm) on an irradiated portion thereof. The resultant samples were heated again at different temperatures in the range of 100° to 1,800° C. for 100 hours. Critical currents Ic of the 12 resultant superconductor films at 17 T were measured, and the results are shown in FIG. 10. The results for a superconductor of the same composition but without heat-treatment are represented by curve D.

It is found that an effective heat-treatment temperature range after laser irradiation is 300° to 1,500° C. and preferably 500° to 1,000° C.

EXAMPLE 14

11 samples of sample No. 11 (Nb-Al alloy) in column a of Table 2 were prepared, and were irradiated with a laser beam having a power density of $3.1 \times 10^5$ W/cm$^2$ (a power of 2.5 kW and a beam spot diameter of 1 mm).

Figure 11:
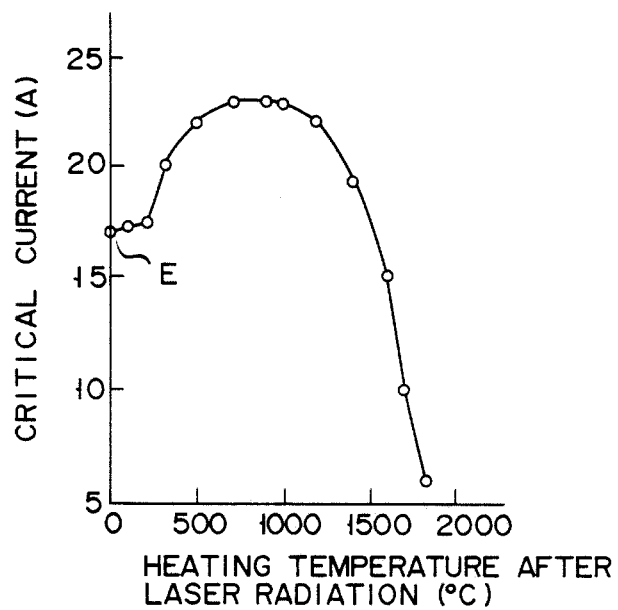

The resultant samples were heated at different temperatures in the range of 100° to 1,800° C. for 100 hours. Critical currents Ic of these 11 superconductors at 17 T were measured, and the results are shown in FIG. 11. The results for a superconductor of the same composition as described above but without heat-treatment are represented by curve E.

As is apparent from FIG. 11, it is found that an effective heat-treatment temperature range after laser irradiation is 300° to 1,500° C. and preferably 500° to 1,000° C.

A third embodiment of the present invention will be described below. In the first step, a compound powder containing Nb and N is sealed in an Nb tube and treated to prepare a starting body. In the second step, the starting body is irradiated with a laser beam. Upon radiation of the laser beam, the body is instantaneously heated to a high temperature, and is then rapidly cooled to room temperature. A δ-phase NbN compound superconductor layer having an NaCl type crystal structure having a 1:1 ratio of Nb to N can thus be obtained. The δ-phase layer has good superconducting characteristics. The shape of the starting body can be changed by a treatment prior to the irradiation of the laser beam. For this reason, the superconductor layer can be used in a variety of industrial applications. In addition, the sample or the laser beam can be moved at a speed of several meters/min during radiation of the laser beam, thereby efficiently preparing the sample at high speed. Moreover, the vacuum chamber need not be used, unlike in sputtering. As a result, good workability can be achieved.

Examples of this embodiment will be described below.

EXAMPLE 15

200 g of commercially available Nb powder having a 99% purity and a particle size of 100 μm were heated in a conventional heating furnace in a nitrogen atmosphere at a temperature of 1,000° C. for 24 hours. An $Nb_2N$-$\beta$ phase was found to have been produced by X-ray diffraction.

The resultant powder was filled and sealed in an Nb tube having an outer diameter of 20 mm and an inner diameter of 10 mm. The Nb tube with the powder was forged, drawn, and rolled to obtain a composite tape having a width of 5 mm and a thickness of 150 μm. Critical temperature Tc of the tape was measured by a 4-terminal resistance method to be 9.0 to 9.2 K. The Tc was the same as that of an Nb tube. In other words, good superconducting characteristics cannot be obtained by only heating Nb powder in $N_2$ gas.

Figure 12:
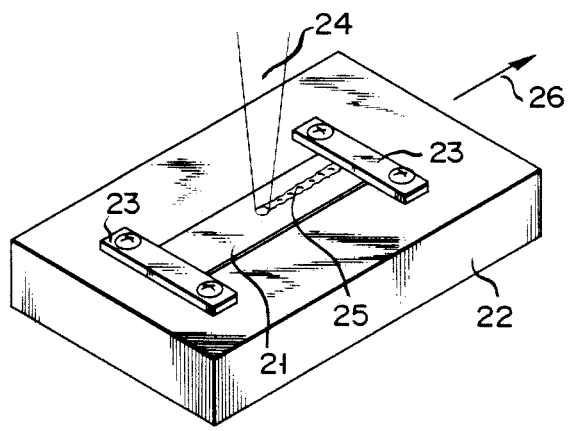
FIG. 12 is a diagram showing another embodiment of the present invention.

Composite tape 21 was cut into 12-cm long samples, which were then fixed on Cu sample jig 22 (FIG. 12) with holder jig 3. Jig 22 was moved at a speed of 3 m/min and the samples were irradiated with laser beam 24. Melt mark 25, rapidly melted and solidified, was left on the irradiated portion. A $CO_2$ gas laser of a power of 1 kW was used. In this case, a laser beam spot diameter was 1 mm. In order to prevent oxidation upon irradiation, the samples were placed in an Ar inert gas atmosphere. The samples were prepared within 2 seconds, which is much shorter than the time required for conventional sputtering.

X-ray diffraction patterns of the resultant samples were then measured. An $Nb_2N$-$\beta$ phase and an NbN-δ phase were thus formed. Critical temperatures Tc of these samples were measured by the 4-terminal resistance method to be as high as 12 K to 14 K. A sample prepared by thermal diffusion had no good superconducting characteristics (Tc=9 K). However, the samples prepared by this embodiment had good superconducting characteristics, since the NbN-δ phase was formed by rapid heating and cooling upon laser irradiation.

EXAMPLE 16

$TaN_x$, $MoN_x$, $(Nb,Ti)N_x$, $NbC_x$, and $Nb(CN)_x$ powders were prepared by the same method as described above, in a heating furnace. $CH_4$(methane) gas was used for $NbC_x$, and $(CN)_2$ gas was used for $Nb(CN)_x$.

$TaN_x$ powder was filled in a Ta tube; MoN, in an Mo tube; and $(Nb_1Ti_1)Nx$, in an $Nb_1Ti_1$ tube. These materials were then treated to prepare tapes. The tapes were then irradiated with a laser beam. In this case, the laser beam had a power of 1 kW and a beam spot diameter of 1 mm. The sample moving speed was 3 m/min.

Critical temperatures Tc and critical currents Ic at 17 T were measured, and the results are shown in Table 4. In all samples, a Tc exceeding 10 K and an Ic as high as 10 A were obtained, in the same manner as for $NbN_x$. B-1 compound superconductors were thus be found to have increased Tc and Ic upon heat-treatment before and after laser irradiation, in the same manner as for A-15 and Chevrel compound superconductors, although the results for the B-1 compound superconductors are not shown.

When an Nb-based powder using a mixture of $NbN_x$ and $NbC_x$ is used, Nb powder may be added thereto. In addition, Ta, Mo and Nb powders may be added to Ta-, Mo- and NbTi-based materials, respectively.

TABLE 4

| | Sample No. | 31 | 32 | 33 | 34 | 35 | 36 |
|---|---|---|---|---|---|---|---|
| a | Powder | $NbN_x$ | $NbC_x$ | $Nb(CN)_x$ | $TaN_x$ | $MoN_x$ | $(Nb_1T_1)N_x$ |
| b | Laser power Density (W/cm$^2$) | | | | $1.2 \times 10^5$ | | |
| | Tc (K) | 14.2 | 10.0 | 14.3 | 12.1 | 12.0 | 14.3 |
| | Ic at 17T (A) | 15.3 | 9.5 | 16.8 | 10.8 | 11.2 | 14.8 |

What is claimed is:

1. A method of manufacturing a compound superconductor comprising:
   (a) preparing a starting body by mixing powders containing components of a compound superconductor to be manufactured; and
   radiating a laser beam on at least one part of the starting body to heat and melt the starting body, thereby producing a layer of the compound superconductor in the starting body.

2. The method according to claim 1, wherein the laser beam has a power density of not less than $10^4$ W/cm$^2$.

3. The method according to claim 1, further comprising the step of annealing the starting body at a temperature of 400° to 2,000° C. before the second step of radiating the laser beam.

4. The method according to claim 1, further comprising the step of annealing the compound superconductor layer at a temperature of 300° to 1,500° C. after the second step of radiating the laser beam.

5. The method according to claim 1, wherein the first step includes the steps of; mixing predetermined amount of powders containing components of the compound superconductor to be manufactured to obtain a mixture; filling the mixture in a tube; and working the tube to obtain a tape-like starting body.

6. The method according to claim 5, wherein the working step of the first step includes the steps of; drawing the tube to obtain a wire; and rolling the wire to obtain a tape of the starting body.

7. The method according to claim 6, wherein the first step includes the step of removing the outer tube portion of the tape by acid.

8. The method according to claim 1, wherein the first step includes the step of; preparing a powder molded or sintered body which contains at least one of the components constituting a superconductor to be manufactured; dipping the molded or sintered body in a melt containing the remaining components constituting the superconductor to impregnate the melt into the molded or sintered body; and solidifying the melt to obtain a starting body.

9. The method according to claim 8, wherein the first step includes the step of rolling the molded or sintered body to obtain a tape-like starting body after solidifying the melt.

10. The method according to claim 8, wherein the ratio of the melt in the starting body is 5 to 50% by volume.

11. The method according to claim 8, wherein the sintered or molded body is inserted in a niobium tube before or after it is dipped in the melt.

12. The method according to claim 8, wherein the sintered or molded body is inserted in a molybdenum tube before or after it is dipped in the melt.

13. The method according to claim 1, wherein the first step includes the steps of; preparing a powder containing at least one of components constituting a superconductor to be manufactured; and filling the powder in a tube formed of at least one of components constituting the superconductor to obtain a starting body having a predetermined composition.

14. The method according to claim 13, wherein the tube is worked to obtain a tape-like starting body.

15. The method according to claim 14, wherein the powder consists of at least one element selected from the group consisting of Nb, Nb nitride, Nb carbide and Nb cyanide.

16. The method according to claim 15, wherein the tube is made of Nb.

17. The method according to claim 14, wherein the powder essentially consists of at least one element selected from Mo, Mo nitride, Mo carbide and Mo cyanide.

18. The method according to claim 17, wherein the tube is made of Mo.

19. The method according to claim 14, wherein the powder consists essentially of at least one element selected from Ta, Ta nitride, Ta carbide and Ta cyanide.

20. The method according to claim 19, wherein the tube is made of Ta.

21. The method according to claim 14, wherein the powder consists essentially of at least one component selected from NbTi, NbTi nitride, NbTi carbide and NbTi cyanide.

22. The method according to claim 21, wherein the tube is made of a component selected from NbTi and Nb.

23. The method according to claim 5, wherein the starting body is a mixture of one powder selected from Nb and V, and at least one powder selected from Al, Ge and, Si.

24. The method according to claim 5, wherein the starting body is a mixture of an alloy or compound powder, consisting essentially of at least two elements selected from Nb, Al, Ge, Ga, and Si, and Nb powder.

25. The method according to claim 5, wherein the starting body is a mixture of an alloy or compound powder, consisting essentially of at least two elements selected from V, Al, Ge, Ga, and Si, and V powder.

26. The method according to claim 5, wherein the starting body is at least one powder selected from an alloy and a compound, both of which contain at least one element selected from Al, Ge, Ga, and Si, and Nb.

27. The method according to claim 5, wherein the starting body is at least one powder selected from an alloy and a compound, both of which contain at least one element selected from Al, Ge, Ga, and Si, and V.

28. The method according to claim 5, wherein the starting body is a mixture of: at least one powder selected from an alloy and a compound, both of which contain at least one element selected from Al, Ge, Ga, and Si, and Nb; and at least one powder selected from Al, Ge, Ga, and Si, or a powder of an alloy or compound which contains at least two elements selected from Al, Ge, Ga, and Si.

29. The method according to claim 5, wherein the starting body is a mixture of: at least one powder selected from an alloy and a compound, both of which contain at least one element selected from Al, Ge, Ga, and Si, and V; and at least one powder selected from Al, Ge, Ga, and Si, or a powder of an alloy or compound which contains at least two elements selected from Al, Ge, Ga, and Si.

30. The method according to claim 5, wherein the starting body is a mixture of metal M (M is one element selected from Pb, Sn, Cu, and Ag) powder, Mo powder, and S powder.

31. The method according to claim 5, wherein the starting body is a mixture of metal M (M is one element selected from Pb, Sn, Cu, and Ag) sulfide powder and Mo powder.

32. The method according to claim 5, wherein the starting body is a mixture of metal M (M is an element selected from Pb, Sn, Cu, and Ag) sulfide powder, Mo powder, and at least one powder selected from the metal M powder and S powder.

33. The method according to claim 5, wherein the starting body is a mixture of Mo sulfide powder and at least one powder selected from metal M (M is an element selected from Pb, Sn, Cu, and Ag) powder and metal M sulfide powder.

34. The method according to claim 5, wherein the starting body is a mixture of at least one powder selected from metal M (M is an element selected from Pb, Sn, Cu, and Ag) powder and metal M sulfide powder, Mo sulfide powder, and at least one powder selected from Mo powder and S powder.

35. The method according to claim 5, wherein the starting material is a mixture of: at least one powder selected from S powder, metal M (M is an element selected from Pb, Sn, Cu, and Ag) sulfide powder, and Mo sulfide powder; and an alloy or compound powder of metal M and Mo.

36. The method according to claim 5, wherein the starting material is a mixture of: at least one powder selected from S powder, metal M (M is an element selected from Pb, Sn, Cu, and Ag) sulfide powder and Mo sulfide powder; an alloy or compound powder of the metal M and Mo; and at least one powder selected from the metal M powder and Mo powder.

37. The method according to claim 5, wherein the starting body is one member selected from the group consisting of: a ternary compound powder of metal M (M is an element selected from Pb, Sn, Cu, and Ag), Mo and S; or a mixture of the ternary compound powder and at least one powder selected from the metal M powder, Mo powder, S powder, an alloy or compound powder of the metal M and Mo, metal M sulfide powder, and Mo sulfide powder.

38. The method according to claim 31, wherein the metal M sulfide powder is substituted with at least two metal sulfide powders of different compositions.

39. The method according to claim 33, wherein the Mo sulfide is substituted with at least two Mo sulfides of different compositions.

40. The method according to claim 37, wherein the ternary compound powder of metal M, Mo, and S is substituted with at least two ternary compound powders of metal M, Mo, and S of different compositions.

41. The method according to claim 5, wherein the powder is filled and molded in an Nb or V tube.

42. The method according to claim 5, wherein the mixture is filled and molded in an Mo tube.

43. The method according to claim 8, wherein the molded or sintered body in the first step contains niobium as a major constituent, and the melt contains at least one element selected from aluminum, germanium, and gallium as a major constituent.

44. The method according to claim 8, wherein the molded or sintered body in the first step comprises a plurality of wires containing niobium as a major constituent, and the solution contains at least one element selected from aluminum, germanium, and gallium as a major constituent.

45. The method according to claim 8, wherein the molded or sintered body essentially consists of at least one powder selected from the group consisting of metal M (M is an element selected from lead, tin, copper, and silver), metal M sulfide, sulfur, molybdenum, and molybdenum sulfide; the solution essentially consists of at least one component selected from said group and having a melting point lower than the molded or sintered body; and the starting body obtained by impregnating the molded or sintered body with the solution contains metal M, molybdenum, and sulfur.

46. The method according to claim 8, wherein the molded or sintered body essentially consists of a mixture of one powder selected from metal M powder, metal M sulfide powder, and a mixture thereof, and one powder selected from molybdenum powder, molybdenum sulfide powder, and a mixture thereof, and the solution essentially consists of sulfur.

47. The method according to claim 8, wherein the molded or sintered body essentially consists of molybdenum sulfide powder, and the solution essentially consists of metal M.

48. The method according to claim 8, wherein the molded or sintered body essentially consists of a mixture of one powder selected from metal M sulfide powder, molybdenum powder, and a mixture thereof, and molybdenum sulfide powder, and the solution essentially consists of metal M.

49. The method according to claim 8, wherein the molded or sintered body comprises a plurality of molybdenum wires, and the solution essentially consists of metal M and sulfur.

50. The method according to claim 8, wherein the molded or sintered body is inserted in a niobium tube before or after the molded or sintered body is impregnated with the solution.

51. The method according to claim 8, wherein the molded or sintered body is inserted in a molybdenum tube before or after the molded or sintered body is impregnated with the solution.

* * * * *